US006816030B2

(12) United States Patent
Chang et al.

(10) Patent No.: US 6,816,030 B2

(45) Date of Patent: Nov. 9, 2004

(54) IMPEDANCE MATCHING CIRCUIT FOR REJECTING AN IMAGE SIGNAL VIA A MICROSTRIP STRUCTURE

(75) Inventors: Sheng-Fuh Chang, Chia-Yi Hsien (TW); Jia-Liang Chen, Kao-Hsiung (TW); Cheng-Cheng Liu, Tao-Yuan Hsien (TW)

(73) Assignee: Accton Technology Corporation, Hsin-Chu (TW)

( * ) Notice: Subject to any disclaimer, the term of this patent is extended or adjusted under 35 U.S.C. 154(b) by 92 days.

(21) Appl. No.: 10/065,290

(22) Filed: Oct. 1, 2002

(65) Prior Publication Data

US 2003/0160662 A1 Aug. 28, 2003

(30) Foreign Application Priority Data

Feb. 22, 2002 (TW) ....................................... 91103203 A

(51) Int. Cl.[7] ............................ H01P 1/203; H03H 7/38

(52) U.S. Cl. .......................................... 333/32; 333/204

(58) Field of Search .................................... 333/204, 32

(56) References Cited

U.S. PATENT DOCUMENTS 5,015,976 A * 5/1991 Saka .......................... 333/204
5,886,595 A * 3/1999 Von Stein .................. 333/218
6,067,461 A * 5/2000 Ye et al. ..................... 505/210

OTHER PUBLICATIONS

Hayt, Jr., Engineering Electromagnetics, 1981, McGraw–Hill Book Company, 4th edition, pp. 454–455.*

* cited by examiner

*Primary Examiner*—Stephen E. Jones
(74) *Attorney, Agent, or Firm*—Winston Hsu

(57) ABSTRACT

An impedance matching circuit for providing a lossless target signal transmission and rejecting image signals of heterodyne and super-heterodyne transceiver. The impedance matching circuit includes a grounded metal membrane, a first microstrip line connected with an input circuit, a second microstrip line connected with an output circuit, and a third microstrip line connected with either the first microstrip line or the second microstrip line. The first microstrip line is not connected with the second microstrip line, and the length of the third microstrip line is equal to a quarter wavelength of an image signal. When the target signal and the image signal transmit to the impedance matching circuit, the image signal will bypass to a grounded metal membrane, and the target signal will transmit to the output circuit without signal decay through electromagnetic coupling of the first microstrip line and the second microstrip line.

9 Claims, 6 Drawing Sheets

IMPEDANCE MATCHING CIRCUIT FOR REJECTING AN IMAGE SIGNAL VIA A MICROSTRIP STRUCTURE

BACKGROUND OF INVENTION

1. Field of the Invention

The present invention relates in general to an impedance matching circuit, and more particularly, to an impedance matching circuit having a plurality of microstrip structures providing a lossless target signal transmission and rejecting image signals of heterodyne noise and super-heterodyne noise.

2. Description of the Prior Art

Although a wired communication system is taken for granted as a means of signal transmission for most local area networks (LAN), wireless network applications have gained popularity over the past few years. With continuing development of related technology, the changes brought about by wireless communication are gradually penetrating into almost every field of traditional communication systems. Additionally, the cost of switching from a wired signal transmission to a wireless signal transmission has been slashed due to the maturity of the related technology. Today, in order to avoid troublesome wiring problems, a wireless communication system becomes more and more crucial and is demanded by some local area signal transmissions, such as a wireless application protocol (WAP) browser of a mobile phone, which lets users connect to the Internet and access special designed services and WAP pages.

With the aim of quickly spreading wireless communication technology into every phase of office life and enhancing technological improvement, a standard must be created to ensure compatibility and reliability of signal transmission among all the related devices and systems. Therefore, wireless transmission standards were created by the Institute of Electrical and Electronics Engineers (IEEE), such as the IEEE 802.11 standard in 1997, and the newer standards of IEEE 802.11a and IEEE 802.11b created in 1999. The early standards define the specification of RF-band usages and regulate signal transmission rate. The new version standards of IEEE 802.11a and IEEE802.11b are based on the band signals of 5.8 GHz and 2.4 GHz to specify the physical layer transmission rate. All these specifications can be applied to general transmission signals in the Industrial-Scientific-Medical (ISM) bands, such as bands of 902–928 MHz, 2.4–2.4835 GHz, 5.150–5.350 GHz, and 5.725–5.850 GHz.

Please refer to FIG. 1, which shows a function block diagram of a prior art transceiver 10. The transceiver 10 is a front-end circuit to receive a low-power radio-frequency (RF) signal. Traditionally, there are various modes of processing the RF signal received by the transceiver 10, such as a heterodyne, a super-heterodyne, or a zero intermediate frequency (IF) topology. Because of a DC voltage offset, a transceiver with zero-IF topology is known to have a narrower dynamic range. Moreover, because of circuit design considerations, although a transceiver with either a heterodyne or a super-heterodyne topology is known to have a broader dynamic range, extra filters are required to get rid of unwanted image signals.

The prior art transceiver 10 in FIG. 1 comprises an antenna 11, an input circuit 13, a RF amplifier 14, a mixer 16, a local oscillator 18, an IF amplifier 20, a demodulator 22, and an output device 23. After receiving an RF signal 12 through the antenna 11, the input circuit 13 is utilized to pick up desirable signals and match the impedance between the RF amplifier 14 and the antenna 11. In addition, the input circuit 13 is able to avoid secondary radiation coming from the RF signal 12 received by antenna 11. The RF amplifier 14 is not a necessity in circuits of the transceiver 10, however, with the aid of the RF amplifier 14, the receiving performance of the transceiver 14 is improved. For instance, if the RF amplifier 14 increases the gain of the RF signal 12, the back-end circuits, such as mid-band or base-band circuits, can be easily driven by the amplified signal. Nevertheless, unwanted noises are amplified at the same time. In order to improve the signal-to-noise ratio of the circuit and avoid unwanted radiation coming from the local oscillator 18 through the antenna 11, devices having features of low noise, high forward gain and high reverse isolation are required, with GaAs hetero-junction field effect transistors (FETs) among the candidates.

The mixer 16 functions to convert the RF signal 12 into an IF signal 17 for later amplification. The operation of the mixer 16 is based on the received RF signal 12 and the oscillating signal 17 generated by the local oscillator 18. Taking advantage of a nonlinear circuit, the mixer 16 is capable of generating various kinds of signals, such as an RF signal having the same frequency as the RF signal 12, a signal having a frequency equal to the sum of the frequencies of the RF signal 12 and the oscillating signal 17, a signal having a frequency equal to the difference of the frequencies of the RF signal 12 and the oscillating signal 17, and the other high frequency harmonic signals. Using a filter, a signal having a frequency equal to the difference of the frequencies of the RF signal 12 and the oscillating signal 17 is extracted from all the harmonic signals by the mixer 16. Because it is more difficult and costs more to design a high frequency amplifier for the RF signal 12, than to design a IF frequency amplifier for the IF signal 19, the mixer 16 converts the RF signal 12 into the IF signal 19 and sends the IF signal 19 to the IF amplifier 20. Consequently, the major gain, signal selectivity of the transceiver 10 is determined by the IF circuits, which typically comprises of a channel selection filter and the IF amplifier 20. In the end, a demodulator 22, such as an envelope detector, or a frequency discriminator, is utilized to retrieve the RF signal 12 having larger power from the amplified IF signal 19 and provides the amplified RF signal 12 to drive the output device 23, such as a loudspeaker.

As described hereinbefore, the transceiver 10 generates the IF signal 19 through a signal mixing process of the oscillating signal 17 and the low-power RF signal 12 received by the antenna 11, and an amplified RF signal 12 having enough power to drive the output device 23 can be retrieved from the amplified IF signal 19 by a demodulating process. The transceiver 10 has been used in almost every kind of signal modulation systems, such as amplitude modulation (AM) systems, frequency modulation (FM) systems, single side band (SSB) modulation systems, television systems, radar systems, mobile communication systems, and wireless communication systems. The major reason for such an extensive application comes from the high-selective bandpass effect of the IF amplifier 20, which removes the undesirable band signals other than the IF signal 19.

If the transceiver 10 is operated with a heterodyne or super-heterodyne topology, there are unwanted signals having two optional frequencies produced based on the oscillating signal 17 and the RF signal 12. One unwanted signal has a frequency higher than the frequency of the RF signal 12 received by the antenna 11 and the related phenomenon is called LO high-side injection. The other unwanted signal has a frequency lower than the frequency of the RF signal 12 and the related phenomenon is called LO low-side injection.

Taking LO high-side injection for an example, if the frequency of the oscillating signal 17 is $F_O$, the frequency of the RF signal 12 is $F_{RF}$, and the frequency of the IF signal 19 is $F_{IF}$, the relationship of the three frequencies can be expressed as $F_O=F_{RF}+F_{IF}$. Ideally, after the signal mixing process, the IF signal 19 having a frequency equal to the difference of the frequencies of the oscillating signal 17 and the RF signal 12, that is $F_{IF}=F_O-F_{RF}$, is the only signal passing through the IF amplifier 20. However, there is a noise signal having a frequency $F_I$, where $F_I=F_{RF}+2F_{IF}$, only partially attenuated by the input circuit 13. After the signal mixing process of the noise signal and the oscillating signal 17, the frequency of the corresponding output signal by the mixer 16 is also equal to the frequency $F_{IF}$ of the IF signal 19. That is to say, the noise signal having a frequency $F_I$ will also pass through the IF amplifier 20 and interfere with the desired down-converted RF signal 12. The interfering noise signal is known as the image signal and its frequency is called image frequency.

Correspondingly, taking LO low-side injection as the example, the relationship of the three frequencies among the oscillating signal 17, the RF signal 12, and the IF signal 19 can be expressed as $F_O=F_{RF}-F_{IF}$. Ideally, after the signal mixing process, the IF signal 19 having a frequency equal to the difference of the frequencies of the RF signal 12 and the oscillating signal 17, that is $F_{IF}=F_{RF}-F_O$, is the only signal passing through the IF amplifier 20. However, there is a noise signal having a frequency $F_I$, where $F_I=F_{RF}-2F_{IF}$, only partially attenuated by the input circuit 13. After mixing the noise signal and the oscillating signal 17, the frequency of the corresponding signal output by the mixer 16 is also equal to the frequency $F_{IF}$ of the IF signal 19. The noise signal will also pass through the IF amplifier 20 and bring interference into the desired down-converted RF signal 12. As a result, it is a must for the transceiver 10 to get rid of the image signals before the amplifying process of the IF amplifier 20 to improve the circuit performance.

SUMMARY OF INVENTION

It is therefore a primary objective of the claimed invention to provide an impedance matching circuit having a plurality of microstrip structures providing a lossless target signal transmission and rejecting image signals of heterodyne noise and super-heterodyne noise to solve the above-mentioned problems.

According to the claimed invention, an impedance matching circuit is connected between an input circuit and an output circuit, the input circuit generating a target signal and an image signal associated with the target signal, the image signal being heterodyne noise or superheterodyne noise of the target signal. The impedance matching circuit includes a circuit board having a metal membrane which functions as a ground layer for providing a reference ground voltage and a first, second, and third microstrip circuit. The first microstrip circuit has a first microstrip line positioned on the circuit board and coupling with the metal membrane to form a first signal-coupling structure. The first microstrip line includes a first terminal connected to the input circuit and a second terminal being an open stub. The second microstrip circuit has a second microstrip line positioned on the circuit board and coupling with the metal membrane to form a second signal-coupling structure. The second microstrip line includes a first terminal being open-circuited and a second terminal connected to the output circuit. The third microstrip circuit has a third microstrip line, with a third predetermined length being determined according to a frequency of the image signal, and positioned on the circuit board and coupling with the metal membrane to form a third signal-guiding structure. The third microstrip line includes a first terminal connected to either the first microstrip line or the second microstrip line and a second terminal being open-circuited. The first, second, and third microstrip lines are conductive bars. When the target signal and the image signal are both inputted into the impedance matching circuit, the image signal will bypass through the third microstrip line toward the ground layer, and the first microstrip line couples with the second microstrip line to generate an electromagnetic coupling to pass the target signal from the first microstrip line to the second microstrip line and output the target signal to the output circuit.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
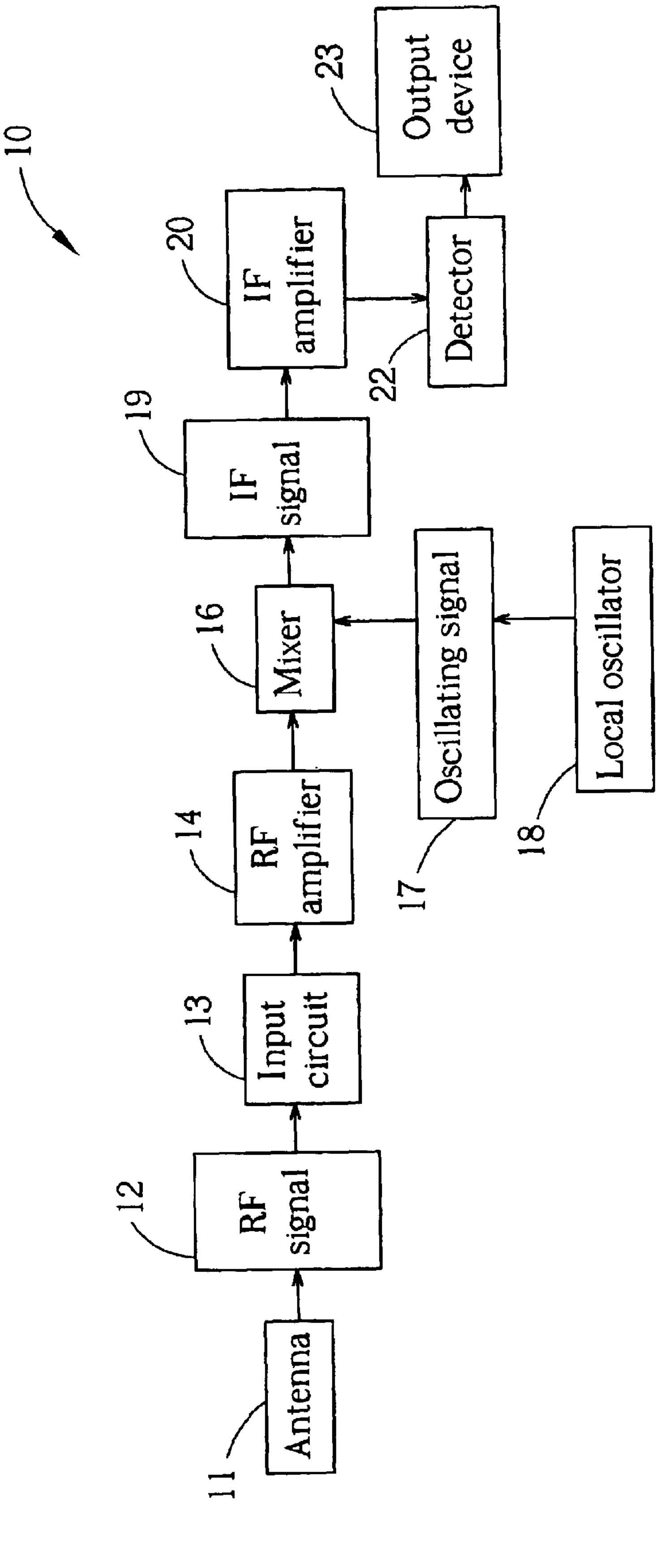
Fig. 1 Prior art
FIG. 1 shows a function block diagram of a prior art transceiver.
Figure 2:
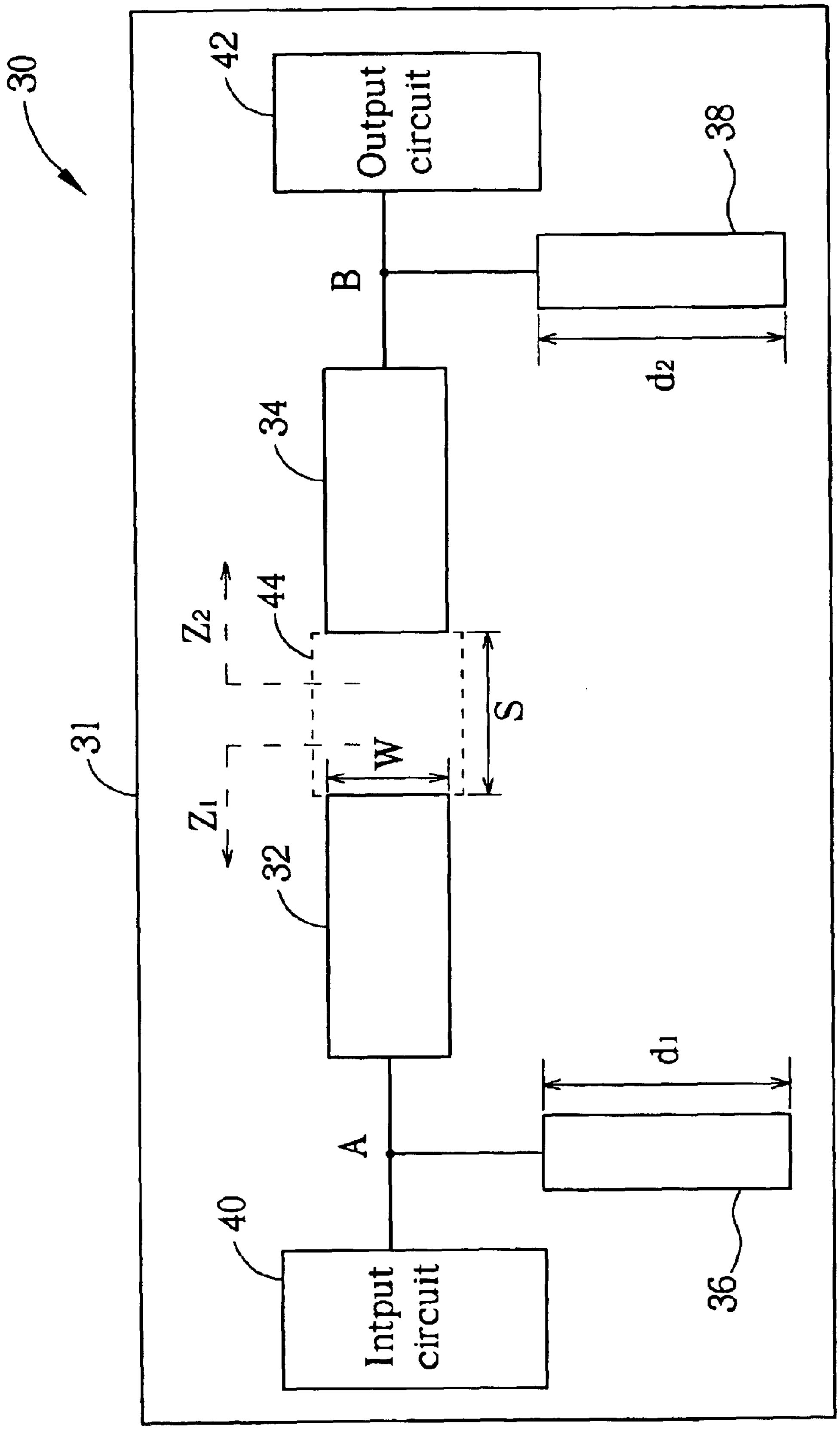
FIG. 2 shows a schematic diagram of an impedance matching circuit according to the present invention.

Please refer to FIGS. 1 and 2. FIG. 2 gives a schematic diagram of an impedance matching circuit 30 according to a first preferred embodiment of the present invention. The impedance matching circuit 30 comprises a-circuit board 31 and a plurality of microstrip lines 32, 34, 36, and 38, which can be used in a wireless communication transceiver with either heterodyne or super-heterodyne topology. The microstrip lines 32, 34, 36, and 38 are placed on one side of the circuit board 31, and the other side of the circuit board 31 is coated with a metal membrane which functions as a ground layer. The metal membrane in conjunction with the microstrip lines 32, 34, 36, and 38 forms signal-coupling structures of the impedance matching circuit 30. One terminal of each of the microstrip lines 32 and 36 is connected to an input circuit 40 at node A, and the other terminals of the microstrip lines 32 and 36 are open-circuited. Similarly, one terminal of each of the microstrip lines 34 and 38 is connected to an output circuit 42 at node B, and the other terminals of the microstrip lines 34 and 38 are open-circuited. The lengths of the microstrip lines 36 and 38 are equal to d1 and d2 respectively and are determined by frequencies of the image signals corresponding to a target signal. The length d1 of the microstrip line 36 can be expressed by the following mathematic formula.

$$d1 = \frac{C}{4\sqrt{\varepsilon}\, f1} \quad \text{(equation 1)}$$

In equation 1, C is the speed of light, $\epsilon$ is the dielectric constant of the dielectric material between the metal membrane and the microstrip lines, and f1 is a frequency of one image signal. Based on the length d1 of the microstrip line 36, the image signal having a frequency of f1 will bypass to the grounded metal membrane due to an equivalent RF short circuit at node A between the metal membrane and the microstrip line 36 and cannot be transmitted to the output circuit 42.

However, in order to get rid of both the heterodyne noise and the super-heterodyne noises, the impedance matching circuit 30 must take advantage of two microstrip lines 36 and 38 having lengths of d1 and d2 respectively to remove image signals coming from either heterodyne or super-heterodyne signal processing. Therefore, the length d2 of the microstrip line 38 is determined by a frequency f2 of the other image signal and can be expressed by the following mathematic formula.

$$d2 = \frac{C}{4\sqrt{\varepsilon}\, f2} \qquad \text{(equation 2)}$$

The definitions of C and ∈ in equation 2 are the same as in equation 1. Based on the length d2 of the microstrip line 38, the image signal having a frequency of f2 will bypass to the grounded metal membrane due to an equivalent RF short circuit at node B between the metal membrane and the microstrip line 38 and cannot be transmitted to the output circuit 42. Consequently, the impedance matching circuit 30 removes image signals from both heterodyne or super-heterodyne signal processing.

For instance, in the transceiver 10 with LO high-side injectiontopology applied to receive a target signal in the Industrial-Scientific-Medical bands, an image signal having a frequency of 6.25 GHz is generated based on the RF signal 12 having a frequency of 5.85 GHz in conjunction with a predetermined IF signal having a frequency of 220 MHz. Alternatively, based on the transceiver 10 with LO low-side injection, an image signal having a frequency of 5.35 GHz is produced. If the dielectric material between the microstrip line 36 and the metal membrane has a relative dielectric constant of 2.4 and the length d1 of the microstrip line 36 is 7.6 mm, the image signal having a frequency of 6.25 GHz is suppressed. Similarly, if the dielectric material between the microstrip line 38, the metal membrane has a relative dielectric constant of 2.4, and the length d2 of the microstrip line 38 is 8.5 mm, the image signal having a frequency of 5.35 GHz is suppressed. As a result, according to the first preferred embodiment, with the aid of microstrip lines 36 and 38, the image signals coming from either LO high-side injection or LO low-side injection processing are suppressed.

The two open stubs of the microstrip lines 32 and 34 are electromagnetically coupled to each other through a predetermined gap spacing to realize a J-inverter 44, which is basically an impedance transformer. The impedance transform of the J-inverter 44 functions to couple the target signal from the microstrip line 32 to the microstrip line 34 from which they are transmitted to the output circuit. In accordance with the first preferred embodiment, an equivalent impedance Z1, evaluated from the J-inverter 44 backward to the microstrip lines 32 and 36 and the input circuit 40, is a real number, i.e. no imaginary part. And an equivalent impedance Z2, evaluated from the J-inverter 44 forward to the microstrip lines 34 and 38 and the output circuit 42, is also a real number. The characteristic impedance of the J-inverter is determined by the gap spacing S between the microstrip lines 32 and 34 in conjunction with the width W of the two open stubs of the microstrip lines 32 and 34. For instance, if the characteristic impedance of the J-inverter 44 is J, the microstrip lines 32 and 34 can be adjusted to acquire equivalent impedances Z1 and Z2 to satisfy the following relationship.

$$J^2 = Z1 \times Z2 \qquad \text{(equation 3)}$$

Consequently, the equivalent impedances, Z1 and Z2, are matched to each other through the J-inverter, and the target signal can be transmitted to the output circuit 42 without signal reflection.

In accordance with the first preferred embodiment, the microstrip line 36 is utilized to suppress the image signal from the transceiver 10 with LO high-side injection topology and the microstrip line 38 is utilized to suppress the image signal from the transceiver 10 with LO low-side injection topology. Obviously, if the lengths d1 and d2 of the microstrip lines 36 and 38 are adjusted and switched, the microstrip line 36 can be utilized to suppress the image signal from the transceiver 10 with LO low-side injection topology and the microstrip line 38 can be utilized to suppress the image signal from the transceiver 10 with LO high-side injection topology. As a result, either design of the microstrip lines 36 and 38 is able to suppress both the image signals of the heterodyne and the superheterodyne transceiver.

Figure 3:
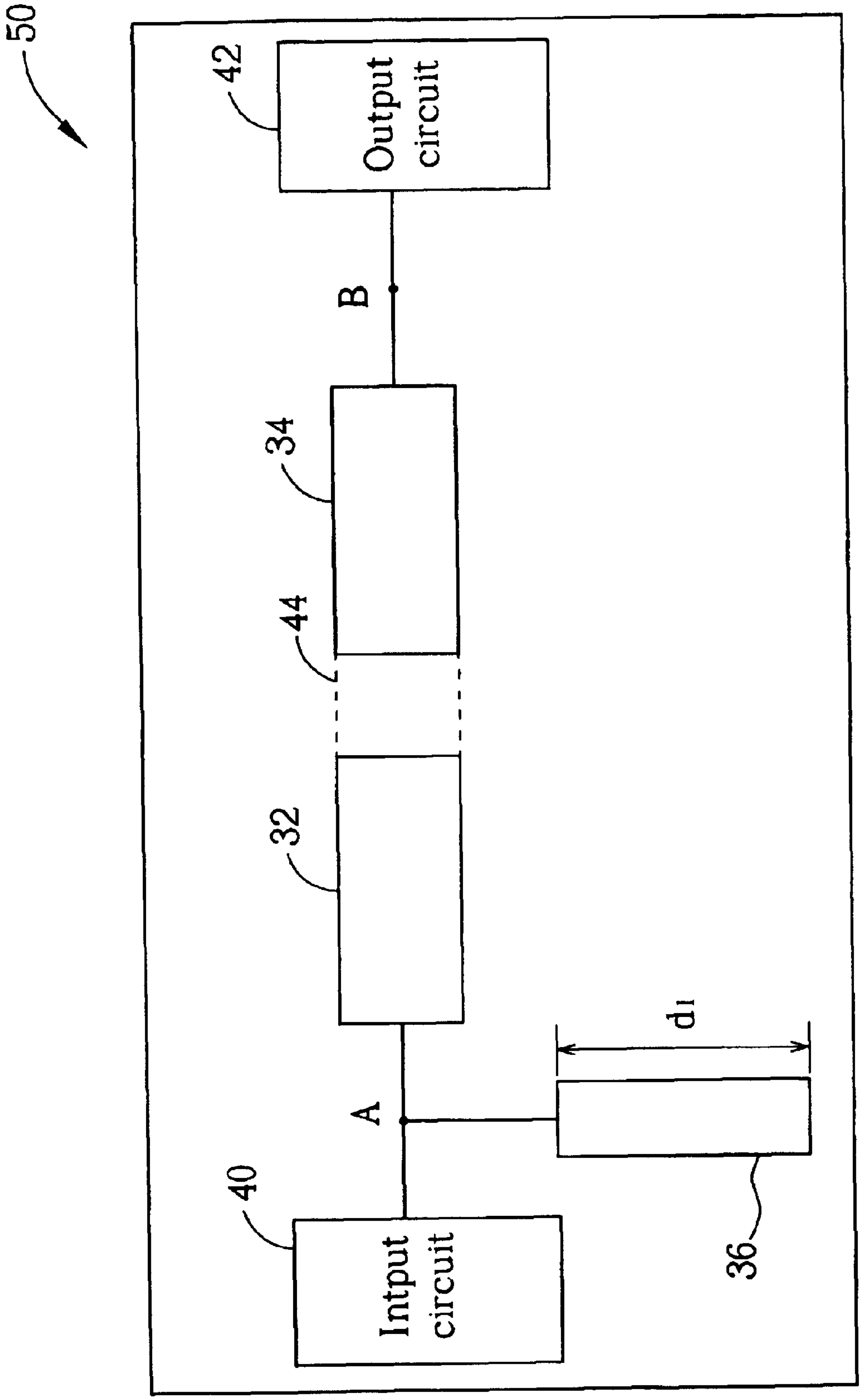
FIG. 3 shows a schematic diagram of another impedance matching circuit according to the present invention.

Please refer to FIGS. 1, 2, and 3. FIG. 3 shows a schematic diagram of an impedance matching circuit 50 according to a second preferred embodiment of the present invention. The impedance matching circuit 50 is actually a simplified version of the impedance matching circuit 30 and is utilized to suppress only the image signal from the transceiver 10 with LO high-side injection topology. The circuit operation of the impedance matching circuit 50 is similar to that of the impedance matching circuit 30. The length d1 of the microstrip line 36 is determined by equation 1 with f1 equal to the frequency of an image signal of LO high-side injection topology. Correspondingly, the length d1 of the microstrip line 36 can also be adjusted to suppress an image signal of LO low-side injection topology. In addition, the microstrip line 36 can be connected to either node A or node B to suppress the unwanted image signal.

Figure 4:
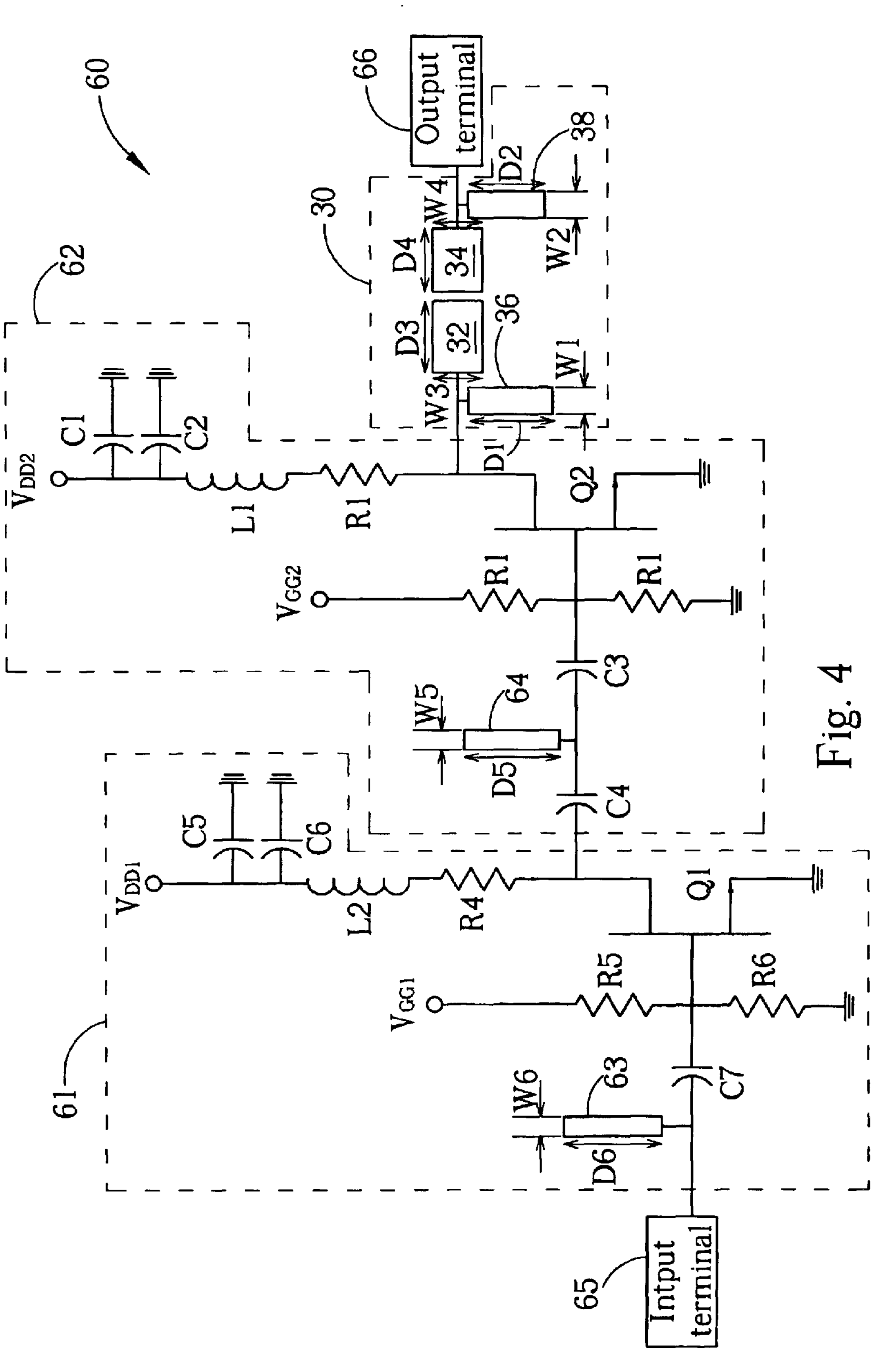
FIG. 4 shows an amplifying circuit embedded with an impedance matching circuit of the present invention.
Figure 5:
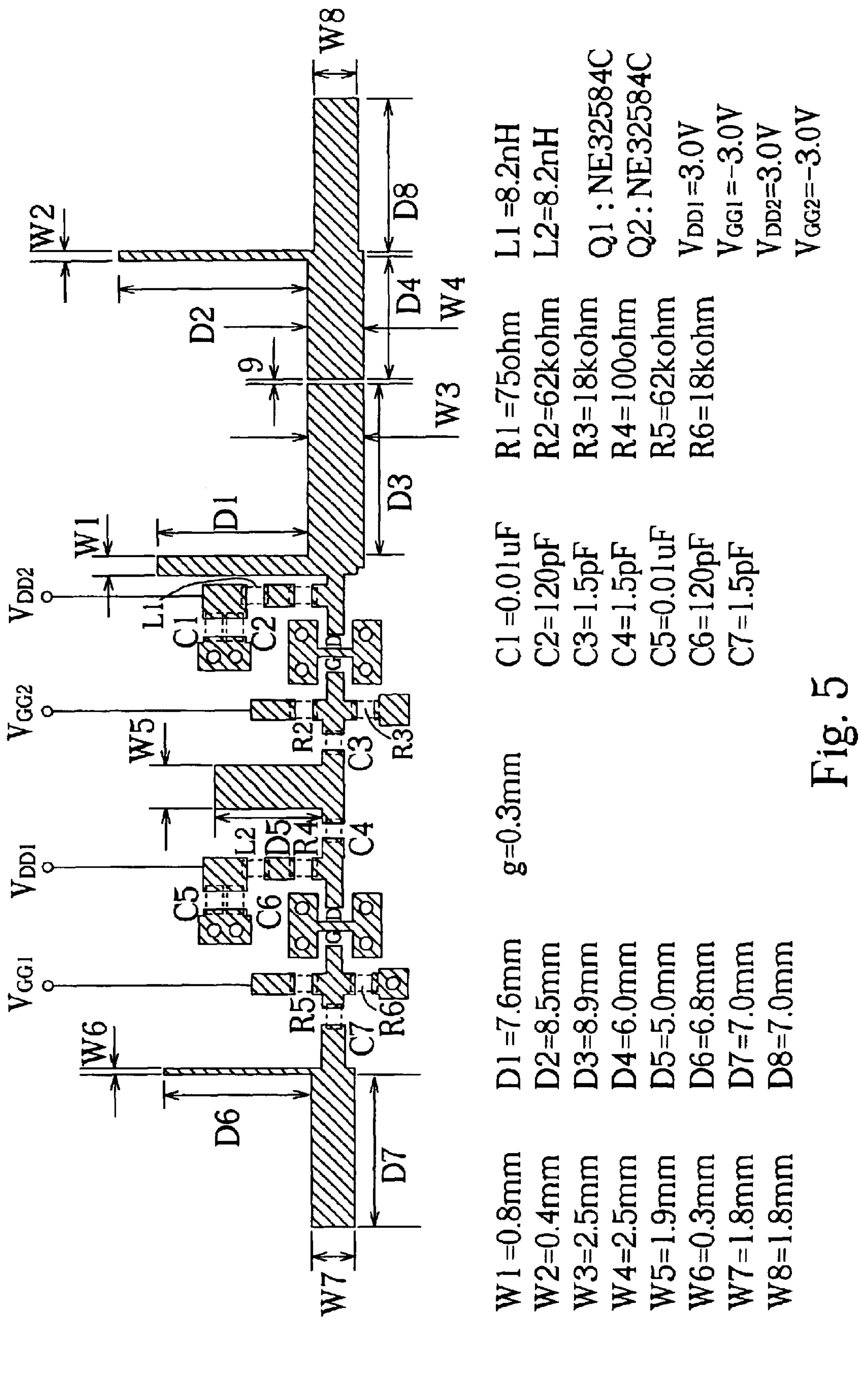
FIG. 5 shows a circuit board layout diagram of the amplifying circuit of FIG. 4.

Please refer to FIGS. 1, 4, 5, and 6. FIG. 4 shows an amplifying circuit 60 embedded with an impedance matching circuit 30 in FIG. 1. FIG. 5 shows a circuit layout diagram of the amplifying circuit 60 in FIG. 4. The signal gain versus frequency curve of the amplifying circuit 60 is shown as a spectrum plot in FIG. 6, with a frequency scale along the abscissa and a gain scale along the ordinate. The amplifying circuit 60 comprises a first driving circuit 61, a second driving circuit 62, and an impedance matching circuit 30. The first driving circuit 61 and the second driving circuit 62 take advantage of microstrip lines 63 and 64 respectively to adjust input impedances of the first driving circuit 61 and the second driving circuit 62. An impedance matching condition can be achieved to avoid a significant decay of the transmitted target signal. Furthermore, the first driving circuit 61 and the second driving circuit 62 comprise a first transistor Q1 and a second transistor Q2 respectively to amplify the target signal inputted from an input terminal 65. The first transistor Q1 and the second transistor Q2 can be chosen to be hetero-junction field-effect transistors (FETs) with device type of NE32584C by the NEC Co., Japan. Other components in FIG. 5 are related to well-known prior art circuits and, for the sake of clarity, will not be repeated here.

After the signal processing of the first driving circuit 61 and the second driving circuit 62, the impedance matching circuit 30 removes the unwanted image signals and transmits the target signal to an output terminal 66. As aforementioned, the amplifying circuit 60 can be applied to receive a target signal in the Industrial-Scientific-Medical bands. Image signals having frequencies of 6.25 GHz and 5.35 GHz are generated through LO high-side injection and LO-low-side injection processing based on the RF signal 12 having a frequency of 5.85 GHz in conjunction with a predetermined IF signal having a frequency of 220 MHz. Therefore, the circuit board system is designed to eliminate noise and image signal having a frequency of 5.35 GHz for LO high-side injection topology, and to eliminate noise and image signal having a frequency of 6.25 GHz for LO high-side injection topology.

Figure 6:
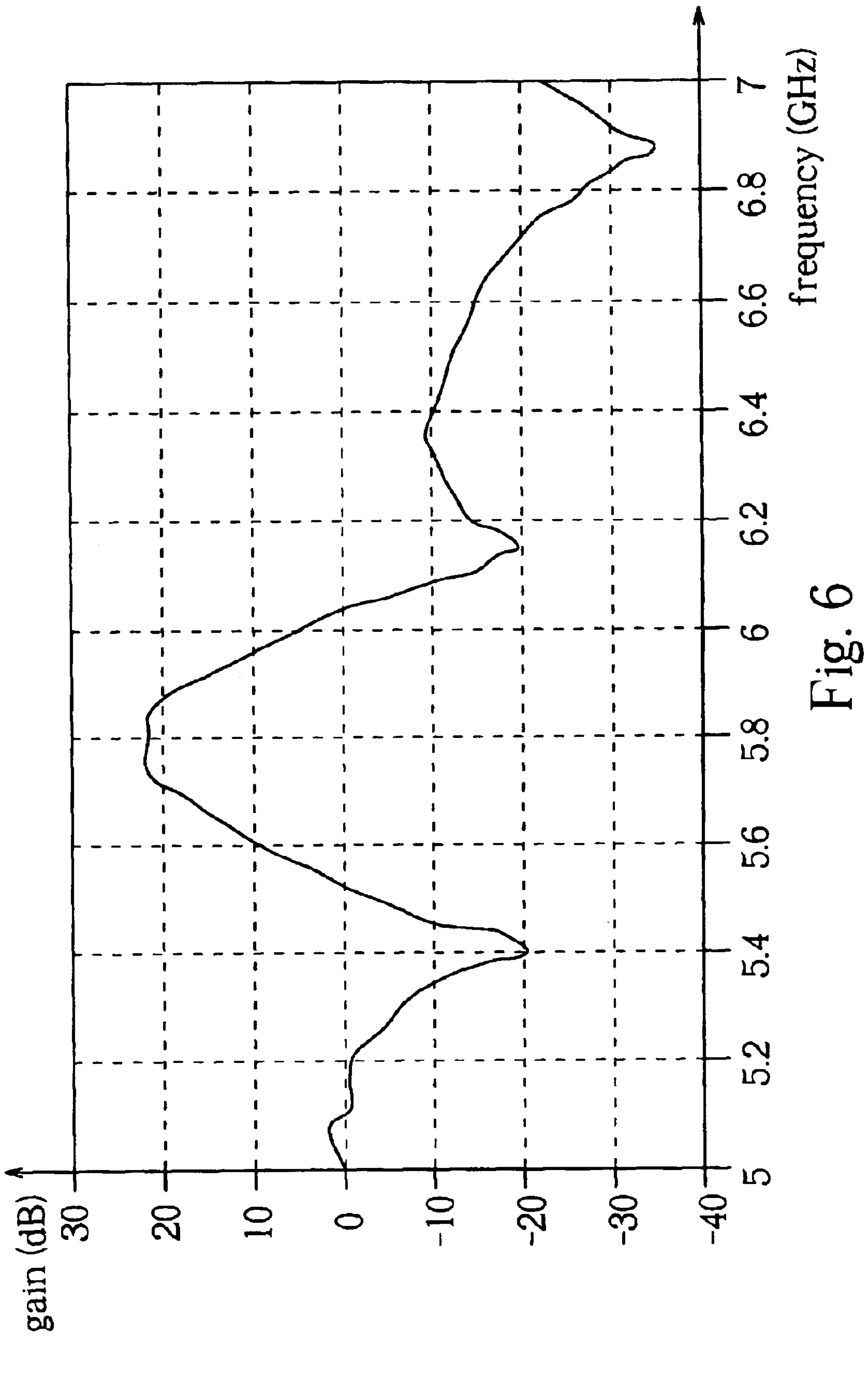
FIG. 6 gives a spectrum plot of signal gain versus frequency curve according to the present invention.

According to the first preferred embodiment of the present invention, a detailed circuit board layout is designed and shown in FIG. 5. Based on signal operation of the circuit board in FIG. 5, a measured result is shown in FIG. 6, where the in-band target signal is shown to have a high gain of about 22 dB and the image signals are decayed significantly.

Founded on the above description, the impedance matching circuit of the preset invention takes advantage of a grounded metal membrane and microstrip lines to form signal-coupling structures for lossless high frequency signal transmission. With the aid of microstrip lines having lengths equal to a quarter wavelengths of image signals, the image signals are coupled to the grounded metal membrane and are taken out from the transmission path. In contrast to the prior art, the present invention discloses an impedance matching circuit that provides a lossless target signal transmission and suppresses the unwanted image signals significantly with a low-cost, uncomplicatedly structured circuit board system.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An impedance matching circuit connected between an input circuit and an output circuit, the input circuit generating a target signal and an image signal associated with the target signal, the image signal being a heterodyne noise or a super-heterodyne noise of the target signal, the impedance matching circuit comprising:

a circuit board comprising a metal membrane which functions as a ground layer for providing a reference ground voltage;

a first microstrip circuit comprising a first microstrip line positioned on the circuit board and coupling with the metal membrane for forming a first transmission line structure, the first microstrip line comprising a first terminal and a second terminal, the first terminal connected to the input circuit, and the second terminal being an open circuit;

a second microstrip circuit comprising a second microstrip line positioned on the circuit board and coupling with the metal membrane for forming a second transmission line structure, the second microstrip line comprising a first terminal and a second terminal, the first terminal being an open circuit, and the second terminal connected to the output circuit; and a third microstrip circuit comprising a third microstrip line with a third predetermined length positioned on the circuit board and coupling with the metal membrane for forming a third transmission line structure, the third microstrip line comprising a first terminal and a second terminal, the first terminal connected to either the first microstrip line or the second microstrip line, the second terminal being an open circuit, and the third predetermined length being determined according to a frequency of the image signal;

wherein the first, second, and third microstrip lines are conductive bars, and when the target signal and the image signal are both inputted into the impedance matching circuit, the image signal will bypass through the third microstrip line toward the ground layer, and the first microstrip line couples with the second microstrip line to generate an electromagnetic coupling so as to pass the target signal from the first microstrip line to the second microstrip line and output the target signal to the output circuit.

2. The impedance matching circuit of claim 1 wherein the third predetermined length is equal to a quarter wavelength of the image signal.

3. The impedance matching circuit of claim 1 wherein an equivalent impedance of the first microstrip line circuit, the third microstrip line circuit and the input circuit is a first impedance, an equivalent impedance of the second microstrip line circuit and the output circuit is a second impedance, and corresponding values of the first and second impedances are real numbers.

4. The impedance matching circuit of claim 3 wherein a space between the second terminal of the first microstrip line and the first terminal of the second microstrip line generates a J-inverter when the electromagnetic coupling is generated between the first and second microstrip lines, and a square of a corresponding J-value of the J-inverter equals the value of the first impedance multiplied by the value of the second impedance.

5. The impedance matching circuit of claim 1 wherein an equivalent impedance of the first microstrip line circuit and the input circuit is a first impedance, an equivalent impedance of the second microstrip line circuit, the third microstrip line circuit, and the output circuit is a second impedance, and corresponding values of the first and second impedances are real numbers.

6. The impedance matching circuit of claim 5 wherein a space between the second terminal of the first microstrip line and the first terminal of the second microstrip line generates a J-inverter when the electromagnetic coupling is generated between the first and second microstrip lines, and a square of a corresponding J-value of the J-inverter equals the value of the first impedance multiplied by the value of the second impedance.

7. The impedance matching circuit of claim 1 being applied to a heterodyne transceiver or a super-heterodyne transceiver.

8. The impedance matching circuit of claim 7 wherein each of the heterodyne transceiver and the super-heterodyne transceiver comprises a local oscillator for generating an oscillating signal, and a difference between the frequency of the image signal and a frequency of the oscillating signal is equal to a difference between a frequency of the target signal and the frequency of the oscillating signal.

9. The impedance matching circuit of claim 1 further comprising:

a fourth microstrip line circuit comprising a fourth microstrip line with a fourth predetermined length positioned on the circuit board and coupling with the metal membrane of the circuit board for forming a fourth transmission line structure, the fourth microstrip line comprising a first terminal and a second terminal, the second terminal being an open circuit;

wherein the first terminal of the third microstrip line is connected to the first microstrip line, the first terminal of the fourth microstrip line is connected to the second microstrip line, the third predetermined length of the third microstrip line is different from the fourth predetermined length of the fourth microstrip line, and the third predetermined length and the fourth predetermined length are respectively determined according to the frequency of the image signal lower than the frequency of the oscillating signal and the frequency of the image signal higher than the frequency of the oscillating signal.

* * * * *